United States Patent
Tran

(10) Patent No.: US 11,277,158 B2
(45) Date of Patent: Mar. 15, 2022

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Nam Binh Tran, Kawasaki Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/007,432

(22) Filed: Aug. 31, 2020

(65) Prior Publication Data
US 2021/0297095 A1 Sep. 23, 2021

(30) Foreign Application Priority Data
Mar. 17, 2020 (JP) .............................. JP2020-046787

(51) Int. Cl.
*H03H 11/28* (2006.01)
*H04B 1/00* (2006.01)
*H03F 3/195* (2006.01)

(52) U.S. Cl.
CPC .............. *H04B 1/006* (2013.01); *H03F 3/195* (2013.01); *H03H 11/28* (2013.01); *H03F 2200/451* (2013.01)

(58) Field of Classification Search
CPC .......... H04B 1/006; H03F 3/195; H03H 11/28
See application file for complete search history.

(56) References Cited

U.S. PATENT DOCUMENTS

| | | |
|---|---|---|
| 6,639,491 B2 | 10/2003 | Toncich |
| 6,690,176 B2 | 2/2004 | Toncich |
| 6,690,251 B2 | 2/2004 | Toncich |
| 6,727,786 B2 | 4/2004 | Toncich |
| 6,737,930 B2 | 5/2004 | Toncich |
| 6,741,211 B2 | 5/2004 | Toncich et al. |
| 6,741,217 B2 | 5/2004 | Toncich et al. |
| 6,744,327 B2 | 6/2004 | Toncich et al. |
| 6,756,947 B2 | 6/2004 | Toncich et al. |

(Continued)

FOREIGN PATENT DOCUMENTS

| | | |
|---|---|---|
| JP | 2006-237711 A | 9/2006 |
| JP | 4303770 B2 | 7/2009 |

(Continued)

*Primary Examiner* — Dinh T Le
(74) *Attorney, Agent, or Firm* — Allen & Overy LLP

(57) ABSTRACT

According to one embodiment, a semiconductor device includes: a selector configured to select one of multiple input terminals and to connect the selected input terminal to a connection terminal connected to one end of an inductor; a low noise amplifier in which an input terminal is connected to a connection terminal connected to the other end of the inductor; and at least one matching circuit. The matching circuit is connected between the two connection terminals and includes a first switch, a second switch, and a capacitor, one end of the capacitor is connected to one of the two connection terminals via the first switch, and the other end of the capacitor is connected to the other of the two connection terminals via the second switch.

10 Claims, 9 Drawing Sheets

(56) References Cited

U.S. PATENT DOCUMENTS

| | | |
|---|---|---|
| 6,765,540 B2 | 7/2004 | Toncich |
| 6,816,714 B2 | 11/2004 | Toncich |
| 6,819,194 B2 | 11/2004 | Toncich et al. |
| 6,825,818 B2 | 11/2004 | Toncich |
| 6,833,820 B2 | 12/2004 | Toncich et al. |
| 6,859,104 B2 | 2/2005 | Toncich et al. |
| 6,861,985 B2 | 3/2005 | Toncich et al. |
| 6,867,744 B2 | 3/2005 | Toncich et al. |
| 6,885,263 B2 | 4/2005 | Toncich |
| 6,885,341 B2 | 4/2005 | Tran et al. |
| 6,903,612 B2 | 6/2005 | Toncich et al. |
| 6,909,344 B2 | 6/2005 | Toncich |
| 6,927,644 B2 | 8/2005 | Toncich |
| 6,937,195 B2 | 8/2005 | Fabrega-Sanchez et al. |
| 6,970,055 B2 | 11/2005 | Toncich |
| 7,009,455 B2 | 3/2006 | Toncich et al. |
| 7,116,954 B2 | 10/2006 | Toncich |
| 7,154,440 B2 | 12/2006 | Toncich et al. |
| 7,164,329 B2 | 1/2007 | Toncich et al. |
| 7,174,147 B2 | 2/2007 | Toncich et al. |
| 7,176,845 B2 | 2/2007 | Fabrega-Sanchez et al. |
| 7,180,467 B2 | 2/2007 | Fabrega-Sanchez et al. |
| 7,184,727 B2 | 2/2007 | Poilasne et al. |
| 7,221,243 B2 | 5/2007 | Toncich et al. |
| 7,221,327 B2 | 5/2007 | Toncich |
| 7,265,643 B2 | 9/2007 | Toncich |
| 7,394,430 B2 | 7/2008 | Poilasne et al. |
| 7,509,100 B2 | 3/2009 | Toncich |
| 7,746,292 B2 | 6/2010 | Poilasne et al. |
| 8,237,620 B2 | 8/2012 | Poilasne et al. |
| 8,674,782 B2 | 3/2014 | Keese et al. |
| 9,431,963 B2 | 8/2016 | Wang et al. |
| 9,755,591 B2 | 9/2017 | Wang et al. |
| 9,941,909 B2 * | 4/2018 | Kehrer ............... H04B 1/006 |
| 10,205,490 B2 * | 2/2019 | Wloczysiak ............ H03F 1/56 |
| 10,305,533 B2 | 5/2019 | Mizokami et al. |
| 10,700,658 B2 * | 6/2020 | Ayranci ............ H04W 72/0453 |
| 2002/0149443 A1 | 10/2002 | Toncich et al. |
| 2006/0189286 A1 | 8/2006 | Kyu et al. |

FOREIGN PATENT DOCUMENTS

| | | |
|---|---|---|
| JP | 6224293 B1 | 11/2017 |
| JP | 6290431 B2 | 3/2018 |
| JP | 6342798 B2 | 6/2018 |

\* cited by examiner

SEMICONDUCTOR DEVICE

CROSS-REFERENCE TO RELATED APPLICATIONS

This application is based upon and claims the benefit of priority from the prior Japanese Patent Application No. 2020-46787 filed in Japan on Mar. 17, 2020; the entire contents of which are incorporated herein by reference.

FIELD

An embodiment described herein relates generally to a semiconductor device.

BACKGROUND

In a wireless transceiver, signals in multiple RF (radio frequency) bands received from one or two or more antennas are input to an RF receiver circuit through an RF front-end circuit of an RF transmitter/receiver module. An external inductor for impedance matching is connected to an amplifier (for example, a pre-low noise amplifier) of the RF front-end circuit.

When the number of input frequency bands increases and impedance matching is performed for multiple frequency bands with one RF front-end amplifier, the impedance matching can hardly be performed by only one external inductor, so that one or two or more additional external inductors should be added, resulting in larger area of the receiver module.

Note that formation of the inductor on a substrate of a semiconductor device, that is, in the semiconductor device leads to an increase in signal loss, which is not preferable.

DETAILED DESCRIPTION

According to one embodiment, a semiconductor device includes: multiple input terminals; a first connection terminal configured to connect with one end of an external inductor; a second connection terminal configured to connect with another end of the inductor; a selector configured to select one of the multiple input terminals and to connect the selected input terminal to the first connection terminal; an amplifier including an input terminal connected to the second connection terminal; and at least one matching circuit connected between the first connection terminal and the second connection terminal and including a first switch, a second switch, and a capacitor, wherein one end of the capacitor is connected to the first connection terminal via the first switch, and another end of the capacitor is connected to the second connection terminal via the second switch.

An embodiment will be described below with reference to the drawings.

Embodiment (Configuration)

Figure 1:
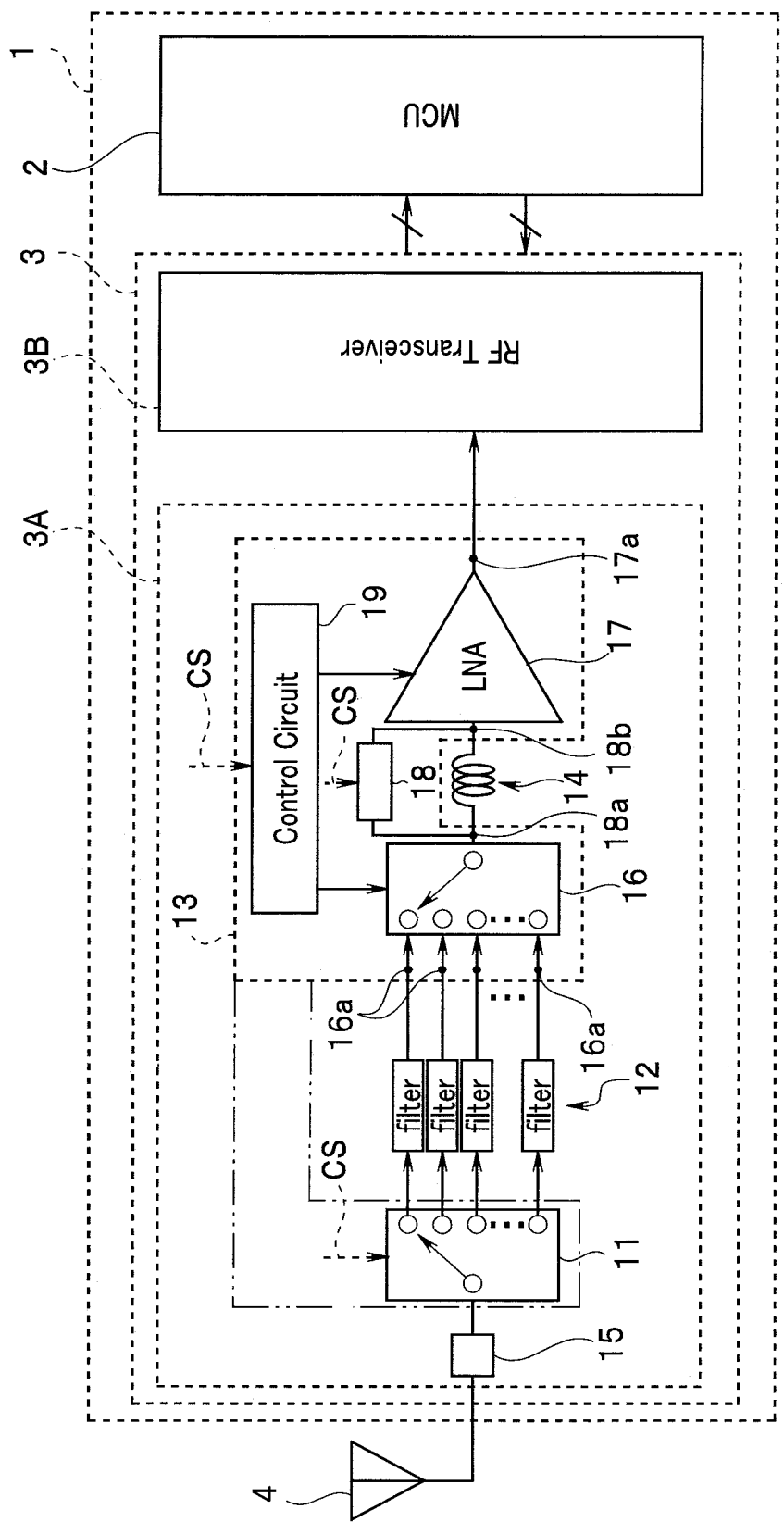
FIG. 1 is a block diagram showing a configuration of a transmitter/receiver module according to an embodiment.

FIG. 1 is a block diagram showing a configuration of a transmitter/receiver module 1 according to the present embodiment. The transmitter/receiver module 1 is used in a multi-band wireless transceiver such as a smartphone. The transmitter/receiver module 1 includes a micro-controller unit (hereinafter, abbreviated as MCU) 2 and a module substrate 3. An antenna 4 is connected to the module substrate 3. Here, the number of antennas 4 is one, but may be two or more.

The MCU 2 includes a CPU (central processing unit), a ROM, a RAM, an interface circuit, and the like. The MCU 2 is connected to the module substrate 3 via various signal lines to output various control signals CS for controlling various circuits on the module substrate 3, receive data of receiving signals received via the antenna 4 from the module substrate 3, and output the data to a host (not shown).

Note that only a receiver configured to process the receiving signal received via the antenna 4 is shown here in the module substrate 3, and a transmitter is not presented.

The module substrate 3 includes an RF front-end module 3A and an RF transceiver 3B. The module substrate 3 is a SOI (silicon on insulator) substrate having a structure in which $SiO_2$ is inserted between a Si substrate and a surface Si layer.

The RF front-end module 3A includes a selector 11, a filter unit 12, a pre-low noise amplifier (hereinafter, abbreviated as pre-LNA) circuit 13, and an inductor 14. The pre-LNA circuit 13 is made here as one semiconductor chip, that is, one semiconductor device, as indicated by a dotted line. Note that the pre-LNA circuit 13 may be configured as one semiconductor chip including the selector 11 as indicated by a two-dot chain line.

The selector 11 includes one input terminal and multiple output terminals, and the input terminal is connected to the antenna 4 via an antenna connection terminal 15. The selector 11 includes the output terminals, and operates so as to select one output terminal from the output terminals to connect to the input terminal, based on the control signal CS according to the frequency-switching operation of the MCU 2. The output terminals of the selector 11 are connected to the filter unit 12.

The filter unit 12 includes multiple bandpass filters corresponding to multi-bands. Each of the output terminals of the selector 11 is connected to one corresponding filter in the filter unit 12. The filter unit 12 has multiple bandpass filters corresponding to the multiple frequency bands in the range from 600 MHz to 900 MHz, for example.

The pre-LNA circuit 13 includes a selector 16, a low noise amplifier (hereinafter, referred to as LNA) 17 as an amplifier, a matching circuit 18, and a control circuit 19.

The selector 16 includes multiple input terminals corresponding to the multiple filters of the filter unit 12 and one output terminal. The input terminals of the selector 16 are connected to multiple input terminals 16a on the semiconductor chip. The multiple input terminals 16a correspond to multiple frequency bands. The selector 16 operates such that one of the input terminals 16a is selected according to the control signal CS output from the MCU 2. The output terminal of the selector 16 is connected to a connection terminal 18a to be described below, and the selector 16 operates to select one of the input terminals 16a and connect the selected input terminal to the connection terminal 18a. The output terminal of the selector 16 is connected to the connection terminal 18a to be described below, and is connected to the LNA 17 via the external inductor 14 connected between the connection terminal 18a and a connection terminal 18b to be described below.

The operations of the selector 16 and the LNA 17 are controlled by the control circuit 19. Based on the control signal CS output from the MCU 2, the selector 16 selects one of the input terminals 16a and the operation of the LNA 17 is controlled.

The LNA 17 is an amplifier, an input terminal of which is connected to the connection terminal 18b. An output of the LNA 17 is input to the RF transceiver 3B via an output terminal 17a on the semiconductor chip. The RF transceiver 3B is configured as one chip, that is, one semiconductor device. Output signals of the RF transceiver 3B are supplied to the MCU 2.

The matching circuit 18 is an impedance matching circuit that includes a capacitor C having a capacitance component and multiple switches and is formed on an SOI substrate which is a semiconductor substrate, that is, in the semiconductor device.

The control circuit 19 receives the control signal CS output from the MCU 2 to control the operations of the selector 16, the LNA 17, and the matching circuit 18.

Figure 2:
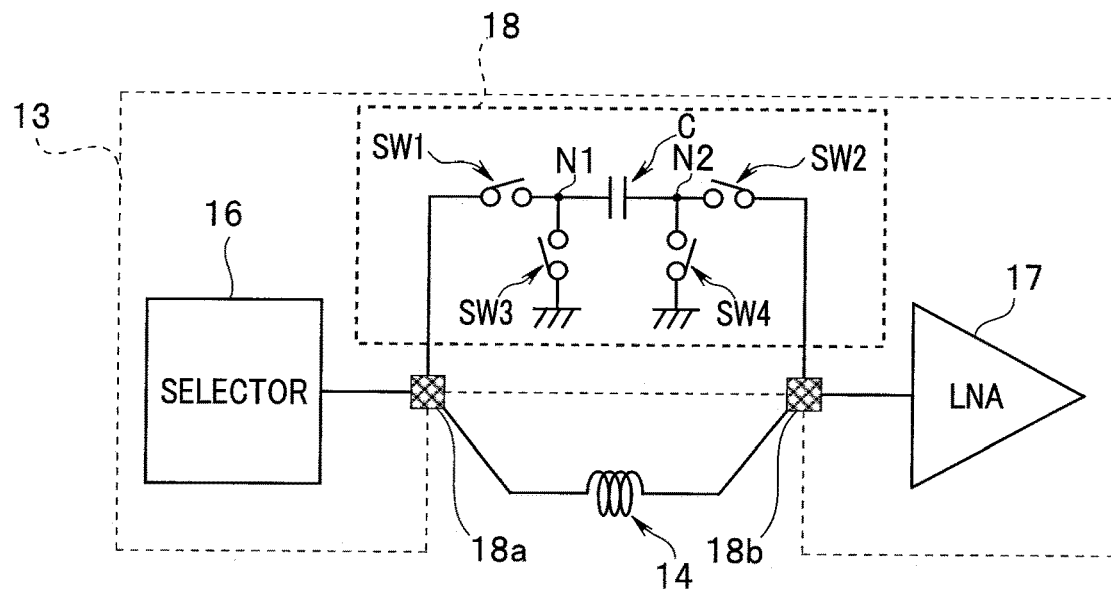
FIG. 2 is a circuit diagram showing a configuration of a matching circuit according to the embodiment.

FIG. 2 is a circuit diagram showing a configuration of the matching circuit 18. The matching circuit 18 includes four switches SW1 to SW4 and a capacitor C.

As described above, the pre-LNA circuit 13 is configured as one semiconductor device and is mounted on a substrate (not shown), and the inductor 14 is externally connected between two connection terminals 18a and 18b on the substrate. In other words, as shown in FIG. 2, the inductor 14 is mounted between the connection terminals 18a and 18b on the substrate. One end of the inductor 14 is connected to the connection terminal 18a, and the other end of the inductor 14 is connected to the connection terminal 18b. The connection terminal 18a is connected to the output of the selector 16, and the connection terminal 18b is connected to the input of the LNA 17.

One end of the switch SW1 of the matching circuit 18 is connected to the connection terminal 18a, and the other end of the switch SW1 is connected to a connection node N1 between the capacitor C and the switch SW3. One end of the switch SW3 is connected to the connection node N1 between the switch SW1 and the capacitor C, and the other end of the switch SW3 is connected to a ground (here, a predetermined reference potential).

One end of the switch SW2 of the matching circuit 18 is connected to the connection terminal 18b, and the other end of the switch SW2 is connected to a connection node N2 between the capacitor C and the switch SW4. One end of the switch SW4 is connected to the connection node N2 between the switch SW2 and the capacitor C, and the other end of the switch SW4 is connected to the ground (here, a predetermined reference potential).

Each of the switches SW1 to SW4 is configured by a field effect transistor (hereinafter, referred to as FET), and is integrated in the semiconductor device configuring the pre-LNA circuit 13.

Figure 3:
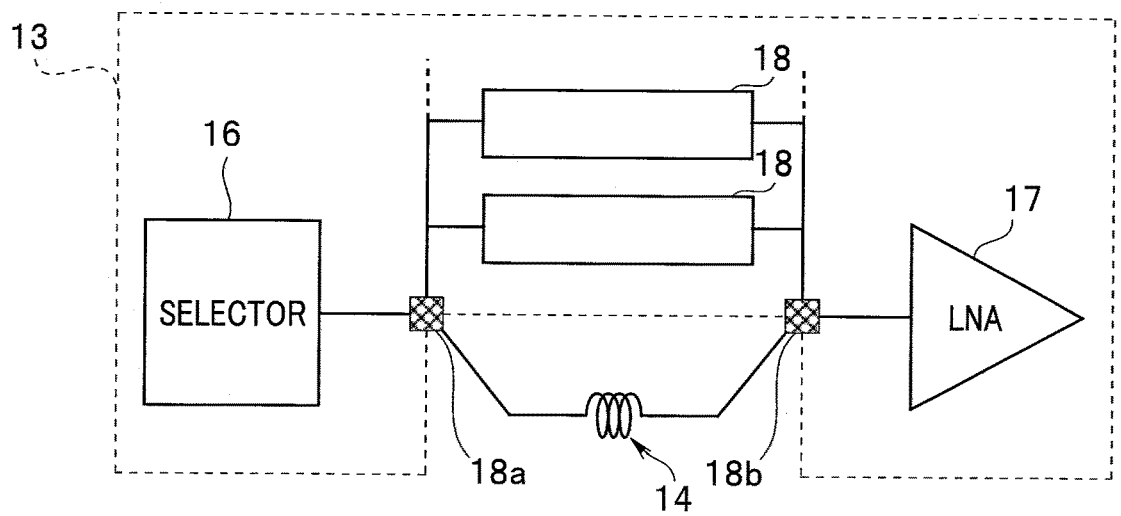
FIG. 3 is a block diagram showing a configuration of a pre-low noise amplifier circuit including multiple matching circuits capable of adjusting impedance according to the embodiment.

Note that the pre-LNA circuit 13 includes one matching circuit 18 here, but may include multiple matching circuits 18 depending on frequency bands of the multi-bands. FIG. 3 is a block diagram showing a configuration of the pre-LNA circuit 13 including multiple matching circuits 18 capable of adjusting impedance. In this case, as shown in FIG. 3, the matching circuits 18 are connected in parallel between the connection terminals 18a and 18b.

Each of the switches SW1 to SW4 of the matching circuit 18 is switched on/off based on the control signal CS output from the control circuit 19. The capacitor C can operate to configure a parallel resonance circuit with the inductor 14, as will be described below.

As described above, the matching circuit 18 is a circuit connected in parallel between the connection terminals 18a and 18b, and includes the switch SW1, the switch SW2, and the capacitor C. One end of the capacitor C is connected to the connection terminal 18a via the switch SW1, the other end of the capacitor C is connected to the connection terminal 18b via the switch SW2, and the capacitor C can configure the parallel resonance circuit with the inductor 14.

In addition, the matching circuit 18 includes the switch SW3, one end of which is connected to the connection node N1 between the switch SW1 and the capacitor C and the other end of which is connected to the reference potential, and the switch SW4, one end of which is connected to the connection node N2 between the switch SW2 and the capacitor C and the other end of which is connected to the reference potential.

(Operation)

The operation of the pre-LNA circuit 13 and the operation of the matching circuit 18 described above will be described below.

The MCU 2 outputs various control signals CS to the RF front-end module 3A according to the operating radio frequency bands.

The input of the selector 11 is selected according to the control signal CS, that is, according to the operating frequency, and is connected to the output. Similarly, the output of the selector 16 is connected to any one of the inputs according to the control signal CS. Each of the switches SW1 to SW4 of the matching circuit 18 is switched on or off according to the control signal CS. In other words, the selected state of the output of the selector 11, the selected state of the input of the selector 16, and the on and off state of each of the switches SW1 to SW4 in the matching circuit 18 are determined in advance according to the operating frequency band. The MCU 2 selects these states determined in advance according to the operating frequency band.

Figure 4:
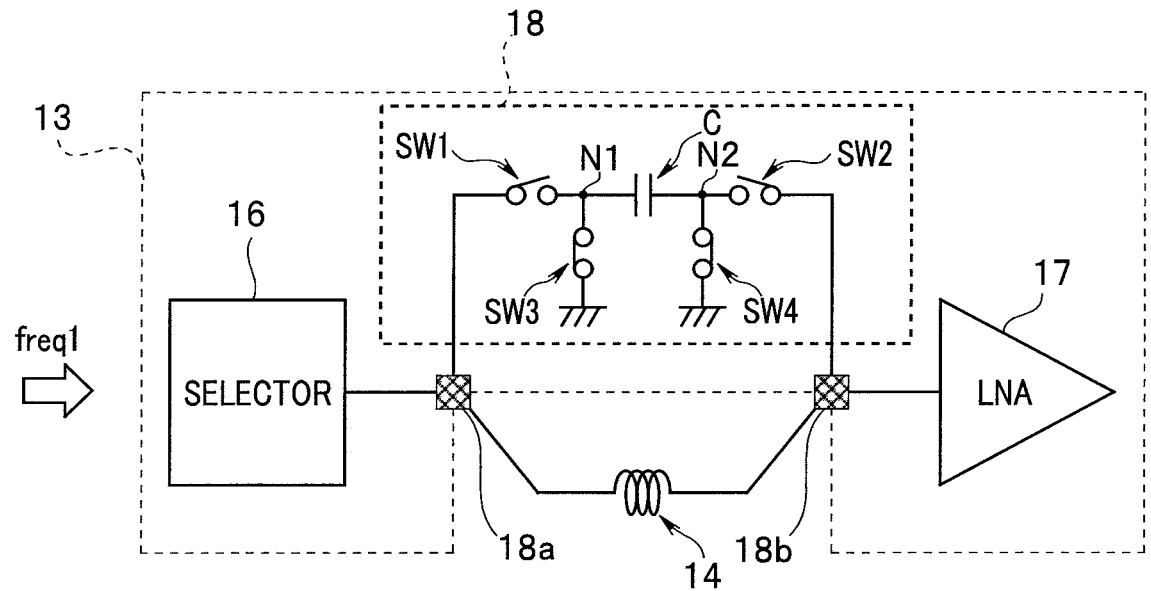
FIG. 4 is a diagram showing states of four switches of the matching circuit according to the embodiment when a capacitor is not used.
Figure 5:
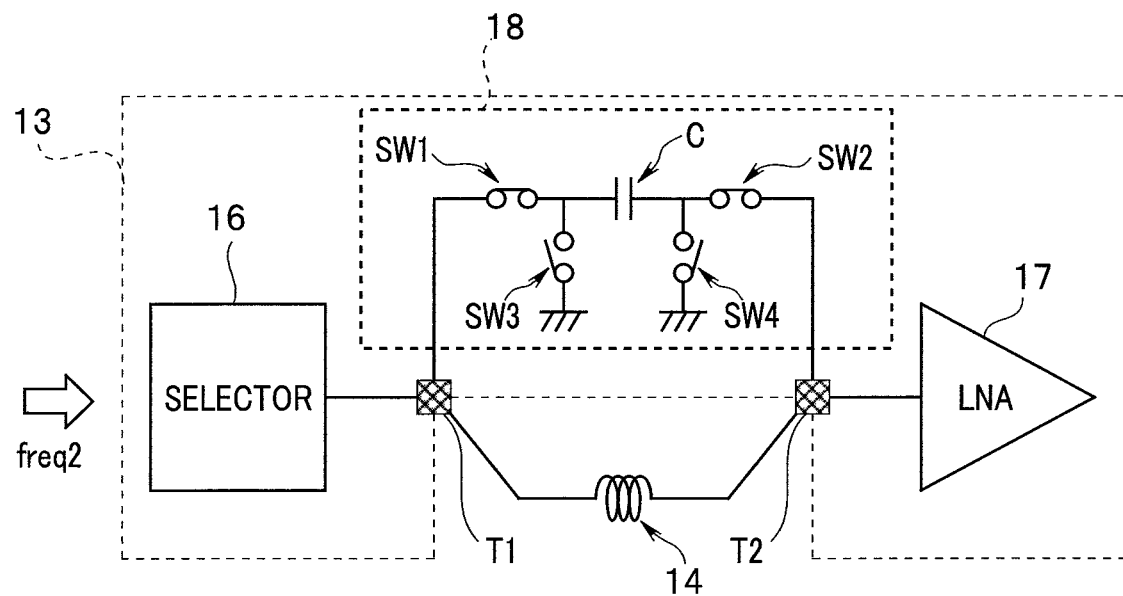
FIG. 5 is a diagram showing states of four switches of the matching circuit according to the embodiment when a capacitor is used.

FIG. 4 is a diagram showing states of the switches SW1 to SW4 of the matching circuit 18 when the capacitor C is not used. FIG. 5 is a diagram showing states of the switches SW1 to SW4 of the matching circuit 18 when the capacitor C is used.

The capacitor C is not used depending on the operating frequency band. Therefore, when IC operates at a certain frequency band (freq1) and the capacitor C is disable, the switches SW1 and SW2 are switched off (that is, opened) and the switches SW3 and SW4 are switched on (that is, closed) as shown in FIG. 4, thus performing the impedance matching only by the inductor 14 externally attached.

The capacitor C is used depending on the operating frequency band. Accordingly, when IC operates at a certain frequency band (freq2) and the capacitor C is used, the switches SW1 and SW2 are switched on (that is, closed) and the switches SW3 and SW4 are switched off (that is, opened) as shown in FIG. 5, thus configuring a parallel resonance circuit by the capacitor C and the inductor 14, and performing impedance matching.

Note that as described above, since each of the switches SW1 to SW4 is configured by an FET, each of the switches SW1 to SW4 behaves like a capacitance component (Coff) when being switched off. Therefore, the capacitance of the capacitor C configuring the parallel resonance circuit is determined in consideration of capacitances of the switches SW3 and SW4 when the switches SW3 and SW4 are switched off.

For example, when two frequency bands are used and the frequency band having a higher frequency of such frequency bands is used, the switches SW1 and SW2 are switched off and the switches SW3 and SW4 are switched on in the matching circuit 18, as shown in FIG. 4. As a result, only an inductance of the external inductor 14 is used for impedance matching, and the capacitance of the capacitor C is not used for impedance matching.

Further, when the frequency band having a lower frequency is used, the switches SW1 and SW2 are switched on and the switches SW3 and SW4 are switched off in the matching circuit 18, as shown in FIG. 5. As a result, the inductance of the external inductor 14 and the capacitance of the capacitor C are used for impedance matching.

As shown in FIG. 4, when only the inductance of the external inductor 14 is used for impedance matching, the switches SW3 and SW4 are switched on and node N1 and N2 are grounded. At this time, since both ends of the capacitor C are grounded, the capacitance of the capacitor C is not seen from each of the connection terminals 18a and 18b.

In addition, as shown in FIG. 5, when the inductance of the external inductor 14 and the capacitance of the capacitor C are used for impedance matching, the switches SW3 and SW4 are switched off and the switches SW1 and SW2 are switched on, and thus the parallel resonance circuit is formed by the inductor 14 and the capacitor C.

Figure 6:
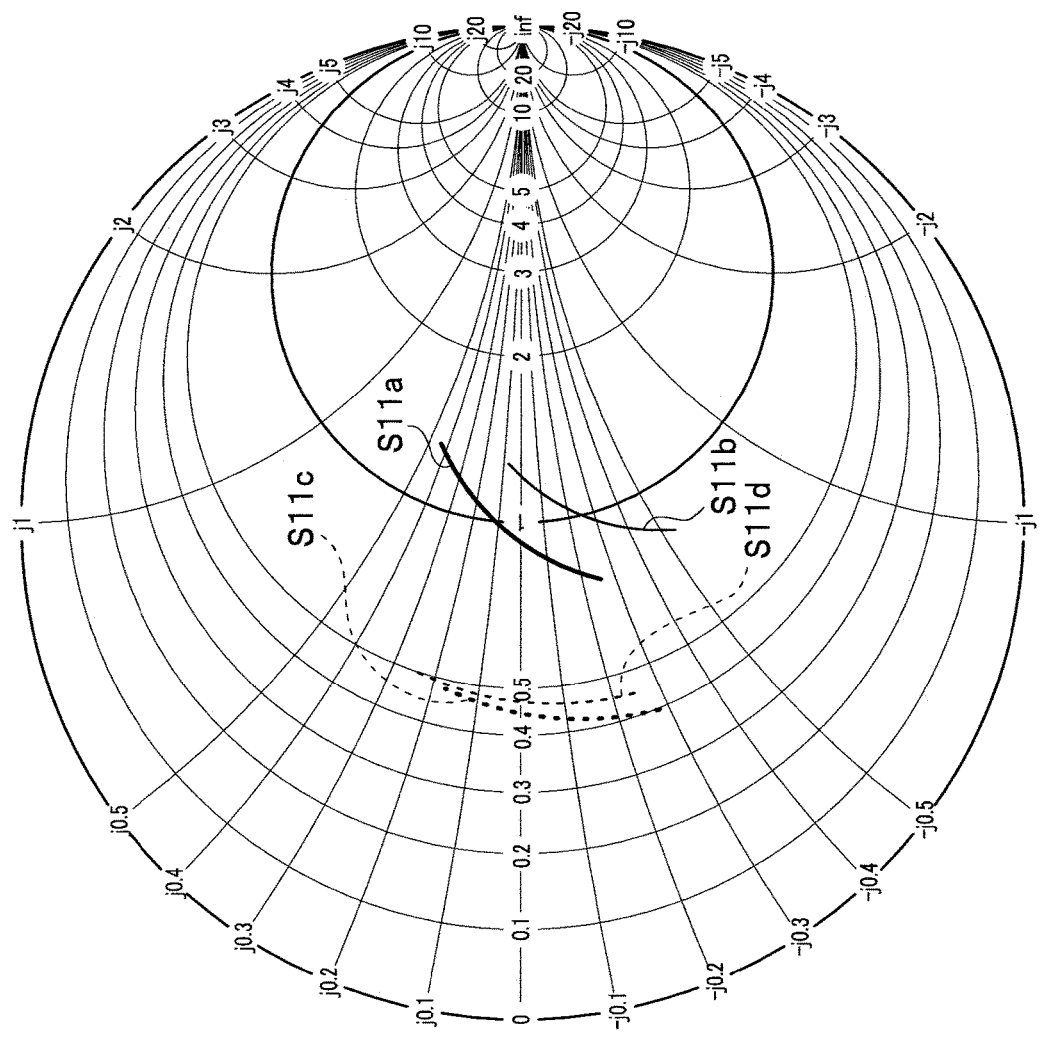
FIG. 6 is a Smith chart showing an input reflection coefficient of an impedance matching circuit shown in FIG. 2 of the embodiment.

FIG. 6 is a Smith chart showing an input reflection coefficient of the impedance matching circuit of the pre-LNA circuit 13 shown in FIG. 2 of the present embodiment. FIG. 6 is a graph showing an input reflection coefficient according to a conventional method using the external inductor 14 having an inductance of 27 nH (nanohenry) and an additional external inductor having an inductance of 24 nH (nanohenry), and showing an input reflection coefficient according to the above-described method of the embodiment using the external inductor 14 having an inductance of 27 nH (nanohenry) and the capacitor C having a capacitance of 300 fF (femtofarad). Here, simulation results are shown for two frequency bands of a frequency band of 900 MHz in the range of from 850 MHz to 960 MHz and a frequency band of 600 MHz in the range of from 610 MHz to 660 MHz.

In FIG. 6, a thin solid line S11b plots an input reflection coefficient at a frequency of 900 MHz band according to the conventional method, a thin dotted line S11d plots an input reflection coefficient at a frequency of 600 MHz band according to the conventional method, a thick solid line S11a plots an input reflection coefficient at a frequency of 900 MHz band according to the present embodiment, and a thick dotted line S11c plots an input reflection coefficient at a frequency of 600 MHz band according to the present embodiment.

In other words, in FIG. 6, the thick solid line S11a and the thick dotted line S11c indicate a case of the above-described embodiment method, the thick solid line S11a plots the input reflection coefficient at the frequency of the 900 MHz band, and the thick dotted line S11c plots the input reflection coefficient at the frequency of the 600 MHz band.

Figure 7:
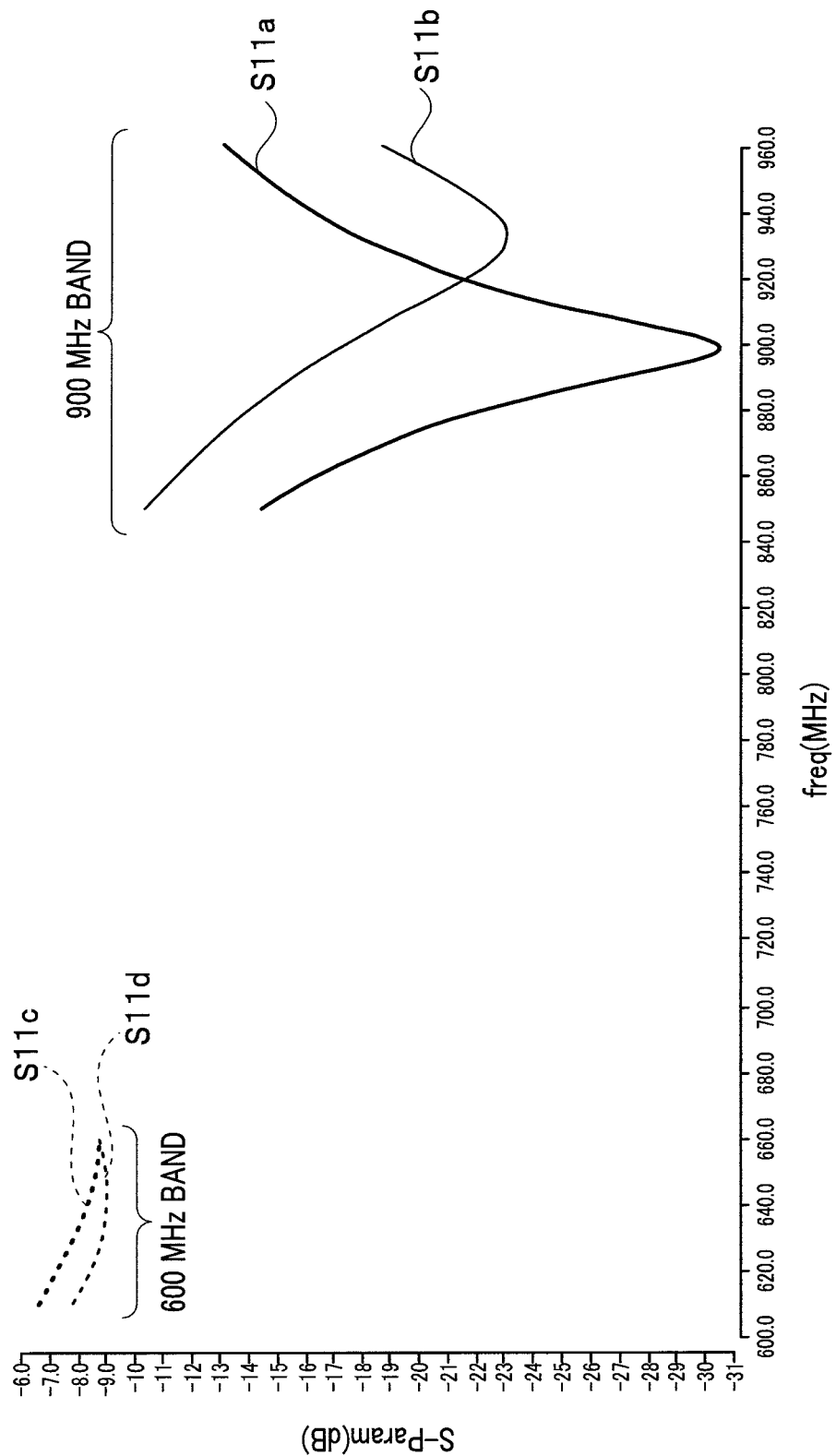
FIG. 7 is a graph showing a magnitude of the input reflection coefficient according to a frequency in the simulation result shown in FIG. 6.

FIG. 7 is a graph showing the input reflection coefficient according to the frequency in the simulation result shown in FIG. 6. In FIG. 7, a horizontal axis indicates a frequency (MHz), and a vertical axis indicate a magnitude (dB) of the input reflection coefficient.

In FIG. 7, a thin solid line S11b and a thin dotted line S11d indicate a case of the conventional method, the thin solid line S11b plots the input reflection coefficient at the frequency of the 900 MHz band, and the thin dotted line S11d plots the input reflection coefficient at the frequency of the 600 MHz band.

In FIG. 7, a thick solid line S11a and a thick dotted line S11c indicate a case of the above-described embodiment method, the thick solid line S11a plots the input reflection coefficient at the frequency of the 900 MHz band, and the thick dotted line S11c plots the input reflection coefficient at the frequency of the 600 MHz band.

Figure 8:
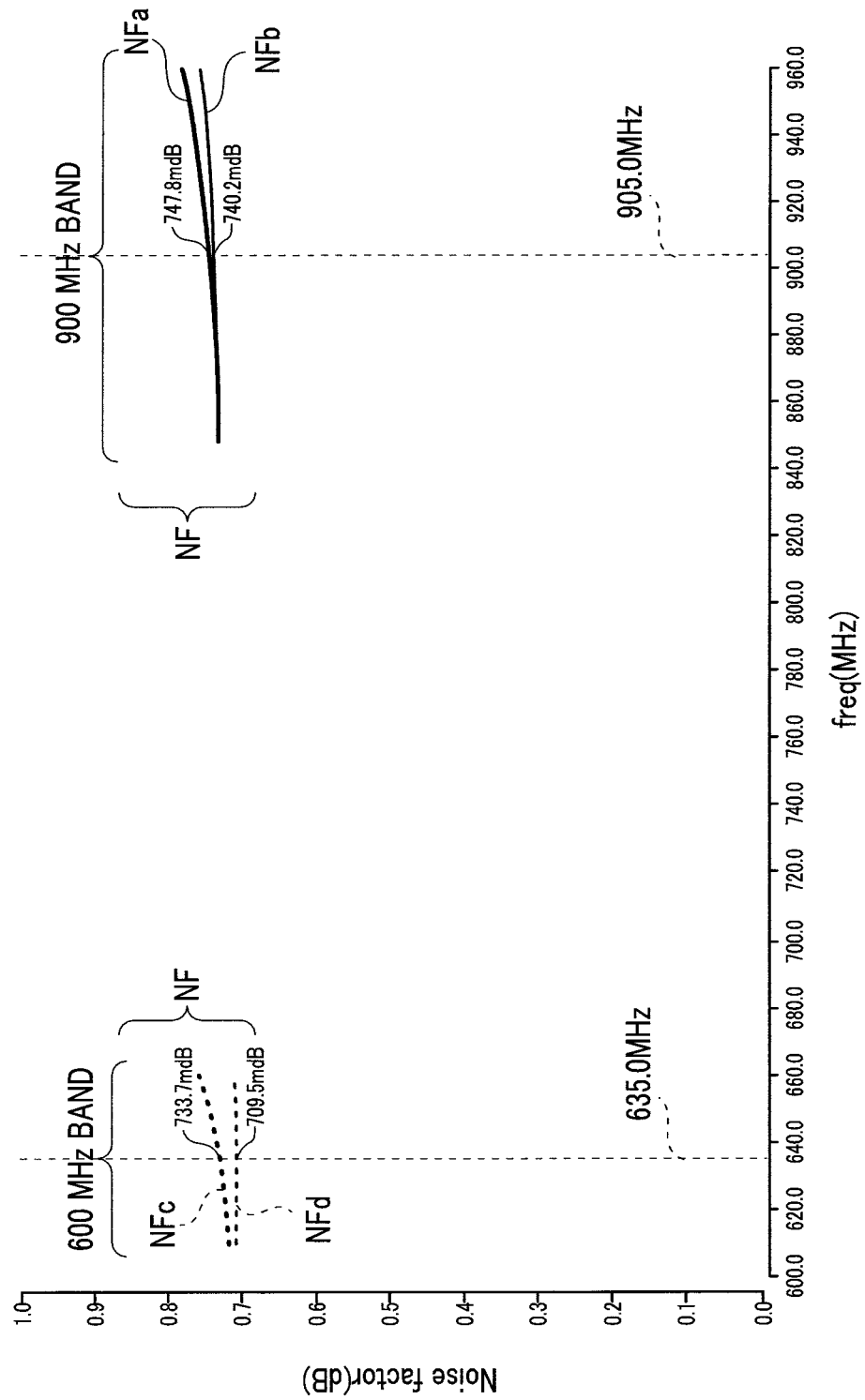
FIG. 8 is a graph showing changes in a magnitude of noise according to a frequency in the simulation result shown in FIG. 6.

FIG. 8 is a graph showing changes in a magnitude of noise according to the frequency in the simulation result shown in FIG. 6. In FIG. 8, a horizontal axis indicates a frequency (MHz), and a vertical axis indicate NF (noise figure: noise factor) (dB) which is a magnitude of noise.

In FIG. 8, a thin solid line NFb and a thin dotted line NFd indicate a case of the conventional method, the thin solid line NFb plots the change of NF at the frequency of the 900 MHz band, and the thin dotted line NFd plots the change of NF at the frequency of the 600 MHz band.

In FIG. 8, a thick solid line NFa and a thick dotted line NFc indicate a case of the above-described embodiment method, the thick solid line NFa plots the change of NF at the frequency of the 900 MHz band, and the thick dotted line NFc plots the change of NF at the frequency of the 600 MHz band.

As shown in FIGS. 6 to 8, the present embodiment method yields the performance substantially similar to the performance of the conventional method using the additional external inductor.

Further, the matching circuit 18 described above is connected with the connection terminals 18a and 18b, and each of the switches SW1 to SW4 may also have a countermeasure effect for electrostatic discharge (ESD) in the transmitter/receiver module 1.

Although only one set of the respective switches SW1 to SW4 is shown in the above-described embodiment, the respective switches SW1 to SW4 may be configured in a multi-stage form. When the respective switches SW are configured in the multi-stage form, the capacitance Coff can be adjusted when the switches SW are switched off. Furthermore, stacking SW in multi-stage also increases the capacity of power handling, and then improves the excessive input performance of the IC.

As described above, according to the above-described embodiment, it is possible to provide a semiconductor device that does not require an additional external inductor and is capable of performing impedance matching in multi-bands without increasing the area of the receiver module.

Modifications of the above-described embodiment will be described below.

First Modification

Figure 9:
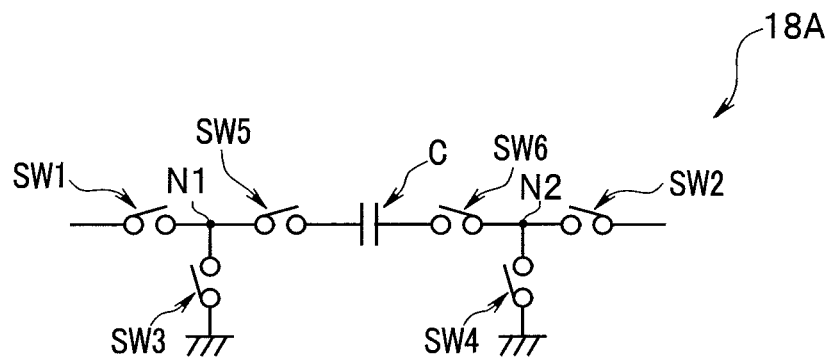
FIG. 9 is a circuit diagram of a matching circuit according to a first modification of the embodiment.

Although the matching circuit 18 of the above-described embodiment includes four switches SW1 to SW4, two switches SW5 and SW6 may be further used. FIG. 9 is a circuit diagram of a matching circuit 18A according to the first modification.

As shown in FIG. 9, in the matching circuit 18A according to the first modification, the switch SW5 is connected between the connection node N1 and the capacitor C, and the switch SW6 is connected between the connection node N2 and the capacitor C. In other words, the matching circuit 18A includes the switch SW5 between one end of the capacitor C and the connection node N1 and the switch SW6 between the other end of the capacitor C and the connection node N2. Each of the switches SW5 and SW6 is configured by an FET and is formed in the semiconductor device that configures the pre-LNA circuit 13.

When the switches SW1 and SW2 are switched off, the switches SW5 and SW6 are also switched off. When the switches SW1 and SW2 are switched on, the switches SW5 and SW6 are also switched on. In other words, when the switches SW3 and SW4 are switched off, the switches SW1, SW2, SW5, and SW6 are switched on, and when the switches SW3 and SW4 are switched on, the switches SW1, SW2, SW5, and SW6 are switched off.

With such a configuration, when only the inductance of the external inductor 14 is used for impedance matching, the isolation of the capacitor C can be enhanced.

Second Modification

Figure 10:
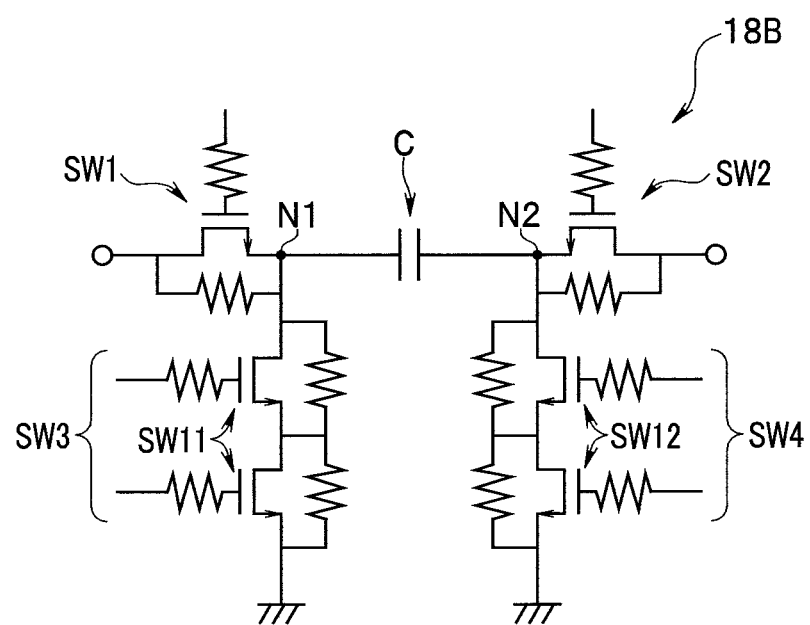
FIG. 10 is a circuit diagram of a matching circuit according to a second modification of the embodiment.

Although the matching circuit 18 of the above-described embodiment includes four switches SW1 to SW4, a shunt switch may be partially further used. FIG. 10 is a circuit diagram of a matching circuit 18B according to the second modification. In the second modification, the switches SW3 and SW4 are configured in a multi-stage form.

In the matching circuit 18B, shunt switches SW11 and SW12 are connected to the nodes N1 and N2, respectively. In each of the shunt switches SW11 and SW12, multiple FETs (two FETs here) are connected in series and a resistor is connected between a drain and a source of each of the FETs.

One ends of the shunt switches SW11 and SW12 are connected to the nodes N1 and N2, respectively, and the other ends of the respective shunt switches SW11 and SW12 are grounded.

As shown in FIG. 10, when the switches SW3 and SW4 are configured in a multi-stage form, the off capacitance (Coff) can be reduced when the switches SW3 and SW4 are switched off, that is, the capacitance to the ground can be reduced, and impedance matching can be easily achieved. In addition, when the switches SW1 and SW3 are configured in a multi-stage form, it is enabled to increase the number of stages of the switches SW forming a path from the input to the ground, yielding the effect to increase power handling of the switch SW alone and so to improve the excessive input performance of the IC.

Third Modification

Although one inductor is simply connected as the external matching circuit in the matching circuit 18 of the above-described embodiment, a matching network circuit having inductive reactance may be connected.

Figure 11:
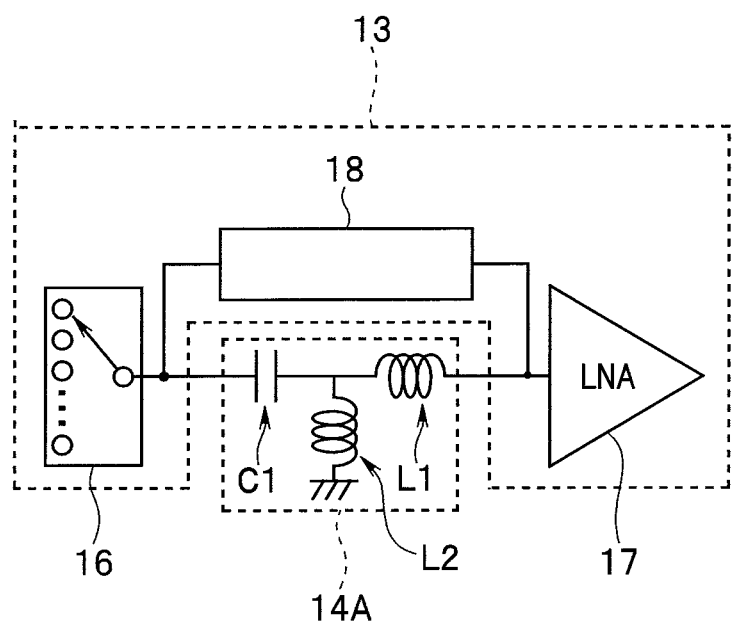
FIG. 11 is a circuit diagram of an external matching circuit according to a third modification of the embodiment.
Figure 12:
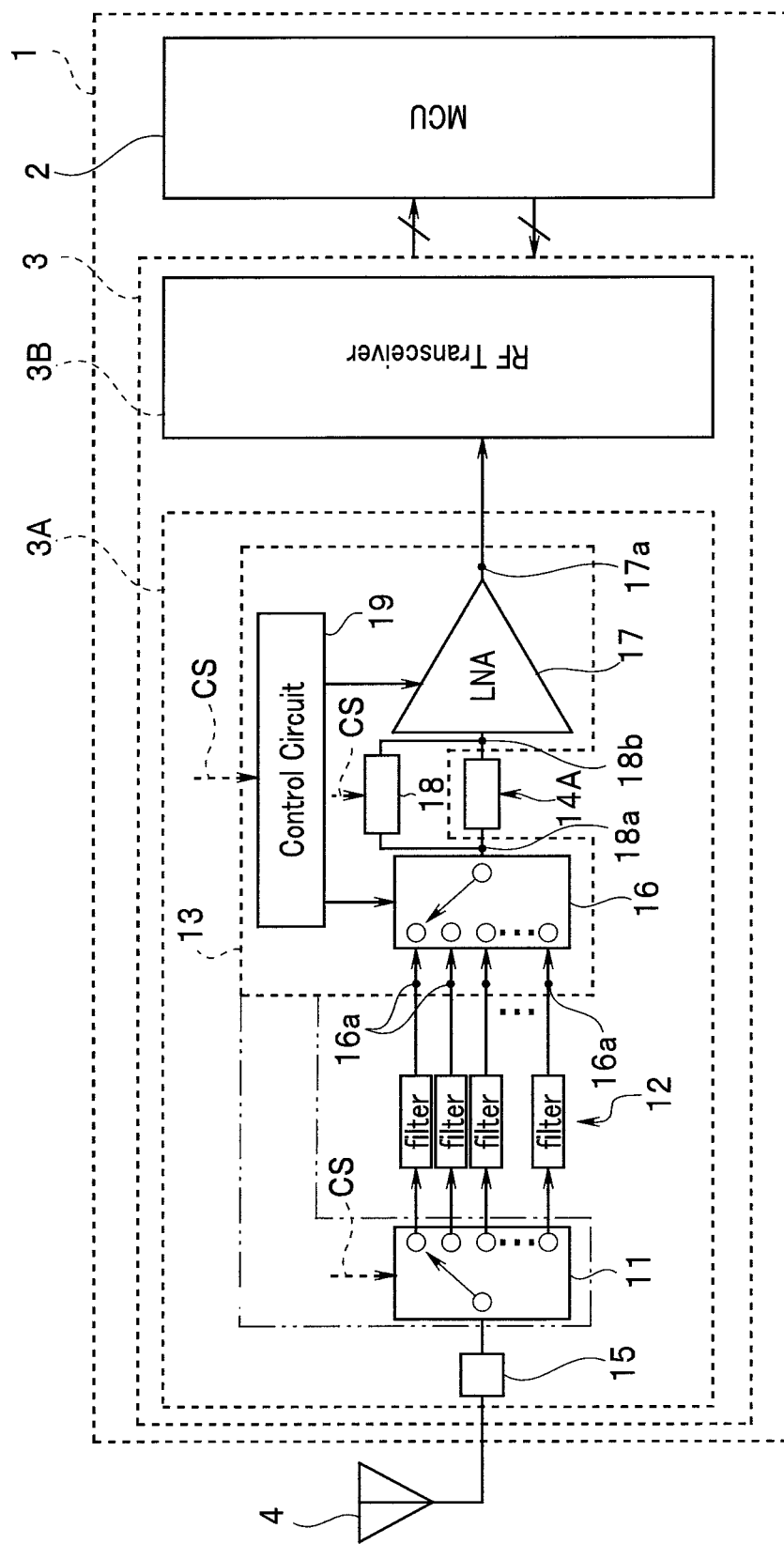
FIG. 12 is a block diagram showing a configuration of a transmitter/receiver module according to the third modification of the embodiment.

FIG. 11 is a circuit diagram of an external matching circuit according to the third modification. FIG. 12 is a block diagram showing a configuration of a transmitter/receiver module 1A according to the third modification.

An external matching circuit 14A according to the third modification includes a capacitor C1 and inductors L1 and L2. The capacitor C1 and the inductor L1 are connected in series, one end of the inductor L2 is connected to a connection node between the capacitor C1 and the inductor L1. The other end of the inductor L2 is grounded.

Since the LNA circuit is configured by an FET, LNA's input impedance is mainly a capacitive impedance, an external matching circuit of inductive reactance may be used instead of the inductor.

When the switches SW1 and SW2 are switched on, similarly to the inductor 14, the matching circuit 18 resonates in parallel with the external matching circuit 14A having an inductive reactance, thereby yielding the effect of enabling to adjust the impedance.

As described above, according to the above-described embodiment and the respective modifications, it is possible to provide a semiconductor device that does not require an additional external inductor and is capable of performing impedance matching in multi-bands without increasing the area of the receiver module.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

What is claimed is:

1. A semiconductor device comprising:
multiple input terminals;
a first connection terminal configured to connect with one end of an external inductor;
a second connection terminal configured to connect with another end of the inductor;
a selector configured to select one of the multiple input terminals and to connect the selected input terminal to the first connection terminal;
an amplifier including an input terminal connected to the second connection terminal; and
at least one matching circuit connected between the first connection terminal and the second connection terminal and including a first switch, a second switch, and a capacitor, wherein one end of the capacitor is connected to the first connection terminal via the first switch, and another end of the capacitor is connected to the second connection terminal via the second switch,
wherein the matching circuit includes:

a third switch having one end connected to a first connection node between the first switch and the capacitor and another end connected to a reference potential; and a fourth switch having one end connected to a second connection node between the second switch and the capacitor and another end connected to a reference potential.

2. The semiconductor device according to claim 1, wherein the matching circuit is formed on an SOI substrate.

3. The semiconductor device according to claim 1, wherein the external inductor includes an inductive reactance.

4. The semiconductor device according to claim 1, wherein the first switch and the second switch are configured by field effect transistors, respectively.

5. The semiconductor device according to claim 1, wherein the third switch and the fourth switch are configured by field effect transistors, respectively.

6. The semiconductor device according to claim 1, wherein the matching circuit includes:

a fifth switch connected between the one end of the capacitor and the first connection node; and a sixth switch connected between the other end of the capacitor and the second connection node.

7. The semiconductor device according to claim 1, wherein the fifth switch and the sixth switch are configured by field effect transistors, respectively.

8. The semiconductor device according to claim 1, wherein the at least one matching circuit comprises multiple matching circuits connected in parallel between the first connection terminal and the second connection terminal.

9. The semiconductor device according to claim 1, wherein each of the third switch and the fourth switch includes multiple transistors.

10. The semiconductor device according to claim 9, wherein the transistors are connected in series in each of the third switch and the fourth switch.

* * * * *